United States Patent

Gonsalves et al.

[19]

[11] Patent Number: 5,839,584
[45] Date of Patent: Nov. 24, 1998

[54] MOTHERBOARD STIFFENER AND GUIDE FOR PROCESSOR MODULES AND PCI CARDS

[75] Inventors: Daniel Derrick Gonsalves, Hudson, N.H.; Robert Antonnucio, Burlington, Mass.; William Izzicupo, Windham, N.H.; James Carney, Peperell, Mass.; Mark Pugliese, Shrewsbury, Mass.; Joseph Spano, North Reading, Mass.; Mathew Palazola, Glouster, Mass.; David Desilets, Hopkington, Mass.

[73] Assignee: Sun Microsystems, Inc., Mountian View, Calif.

[21] Appl. No.: 871,277

[22] Filed: Jun. 9, 1997

[51] Int. Cl.$^6$ .................................................. H05K 7/14
[52] U.S. Cl. ..................... 211/41.17; 211/26; 361/796; 361/802
[58] Field of Search .................... 211/41.17, 26; 361/788, 801, 802, 784, 796

[56] References Cited

U.S. PATENT DOCUMENTS

| | | | |
|---|---|---|---|
| 5,214,572 | 5/1993 | Cosimano et al. | 211/41.17 X |
| 5,317,483 | 5/1994 | Swindler | 361/796 X |
| 5,377,080 | 12/1994 | Lin | 361/802 X |
| 5,394,305 | 2/1995 | Woral et al. | 211/41.17 X |
| 5,594,627 | 1/1997 | Le | 361/801 |
| 5,642,263 | 6/1997 | Lauruhn | 361/802 X |
| 5,708,563 | 1/1998 | Cranston, III et al. | 361/802 X |
| 5,734,551 | 3/1998 | Hileman et al. | 361/801 X |

*Primary Examiner*—Robert W. Gibson, Jr.
*Attorney, Agent, or Firm*—Flehr Hohbach Test Albritton & Herbert LLP,; Julian Caplan

[57] ABSTRACT

A structural foam, injection molded superstructure is attached to a motherboard by means of threaded inserts. The superstructure is formed with guide ways for CPU processor modules, and also for the edges of PCI cards. Features of the structure include cam levers on the CPU modules to install and extract the modules. A metal transverse vertical retaining bracket is attached to the superstructure to hold sides thereof parallel and prevent splaying of the free, open end of the superstructure upon extraction of CPU processor modules. The assembly provides stiffness to the motherboard.

8 Claims, 3 Drawing Sheets

5,839,584

MOTHERBOARD STIFFENER AND GUIDE FOR PROCESSOR MODULES AND PCI CARDS

BACKGROUND OF THE INVENTION

1. Field of the Invention

This invention relates to a new and improved motherboard stiffener and guide for processor modules and PCI cards. More particularly, the invention relates to an assembly which is attached to a portion of a motherboard and functions to support the motherboard against bending, and also to serve as a guide, both for processor modules, and for PCI cards, which are conventionally plugged into sockets mounted on the motherboard.

2. Description of Related Art

The use of motherboards in computers, and the use of processor modules and PCI cards plugged into sockets mounted thereon is conventional in the art. The present invention distinguishes over such prior usages in that provision is made for a stiffener to rigidify the motherboard, and also to provide guideways for the processors and cards plugged into the board.

SUMMARY OF THE INVENTION

A motherboard suitable for mounting in a computer, conventionally has attached thereto sockets to receive processor modules and PCI cards. The present invention provides an assembly, which is attached to the motherboard by screws. The assembly is formed with guides to guide the edges of the processor modules and at least one edge of one or more PCI cards. The module comprises a central horizontal wall from either side edge of which upwardly extend sides, whose edges of which are attached to the motherboard by screws. The aforesaid sides are formed in their inner faces with guides for processor modules, the guides lining up with the motherboard sockets. Projecting downwardly from the horizontal wall on one side of the module is a lower side, the inner face of which is formed with slots functioning as guides for an edge of one or more PCI cards.

The portions of the module heretofore described are preferably formed of an injection molded structural foam, such as GE Noryl foaming resin FN150X. It will be understood that other materials of construction may be employed.

Extending transversely between the outer edges of the left and right upward sides is a stiffener, preferably constructed of stainless steel, such as 304 stainless. The stiffener is shaped to engage both the inner and outer faces of the foam plastic sides, thereby supporting the module structure and insuring that the guides formed on the inner faces of the sides are accurately aligned and spaced apart.

BRIEF DESCRIPTION OF THE DRAWINGS

The accompanying drawings, which are incorporated in and form a part of this specification, illustrate embodiments of the invention and, together with the description serve to explain the principles of the invention.

DESCRIPTION OF THE PREFERRED EMBODIMENT

Reference will now be made in detail to the preferred embodiments of the invention, examples of which are illustrated in the accompanying drawings. While the invention will be described in conjunction with the preferred embodiments, it will be understood that they are not intended to limit the invention to those embodiments. On the contrary, the invention is intended to cover alternatives, modifications and equivalents, which may be included within the spirit and scope of the invention as defined by the appended claims.

Figure 1:
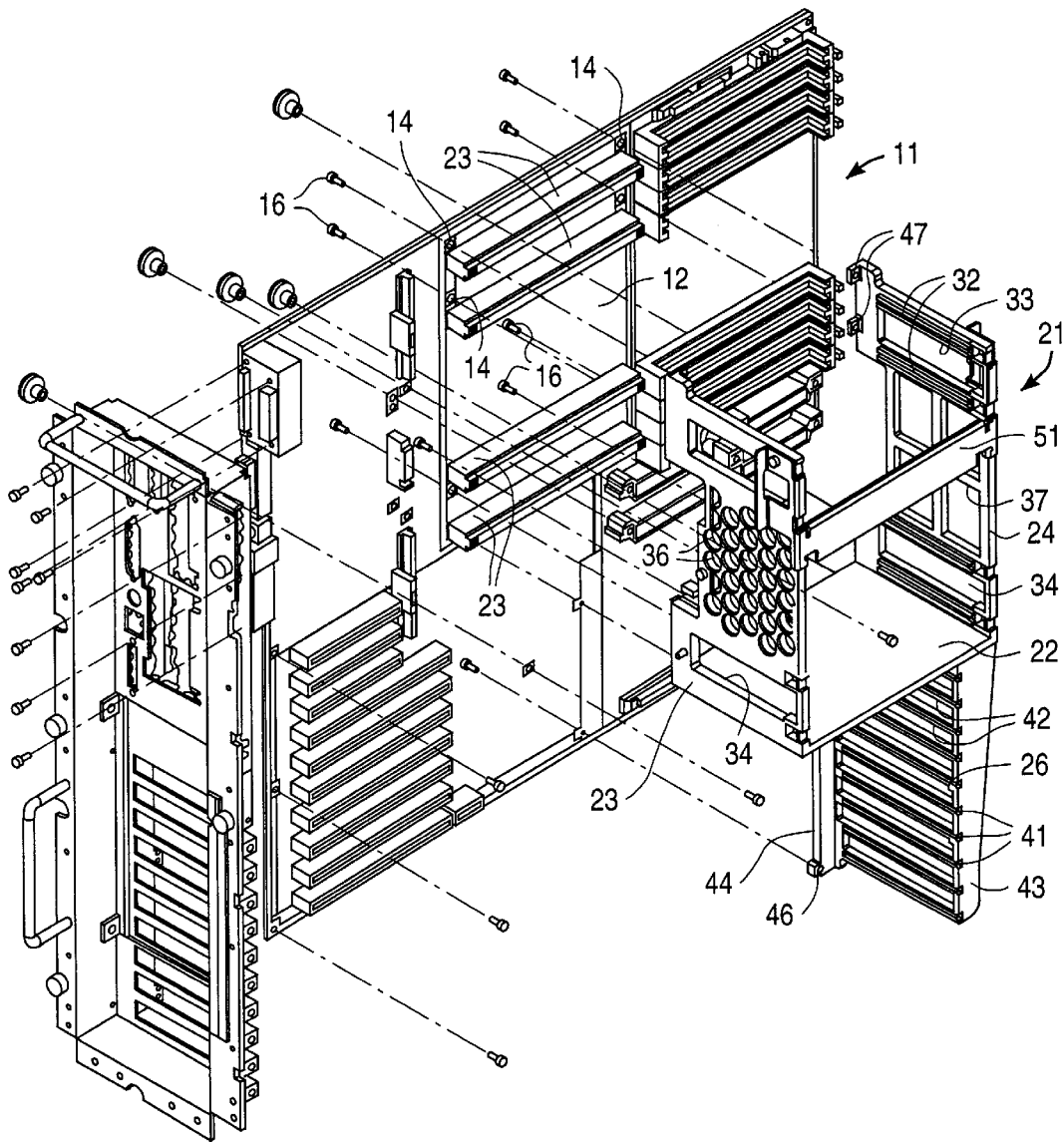
FIG. 1 is an exploded perspective view of a motherboard and module of the present invention.

Motherboard 11 shown in FIG. 1 is a flat, vertically upstanding sheet having, in the particular embodiment illustrated, a central panel 12, on which are mounted CPU sockets 13. At selected locations on the board 11 are apertures 14 for screws 16 so located as to engage ears (hereinafter described) on assembly 21.

Assembly 21 is attached to the motherboard 11 as hereinafter appears. It is preferably molded as a single piece of structural foam such as GE Noryl foaming resin, FN150X, but can be made of other materials or can be made of separate parts secured together. For convenience, description of assembly 21 will commence with a horizontal transverse wall 22. On the left side of wall 22 (as viewed from FIG. 1) there extends vertically upwardly left upward side 23, and from the opposite edge of wall 22 extends right upward, side 24, which is parallel to side 23 and accurately spaced therefrom.

Formed on the inner face of side 23 is a plurality of CPU edge guides 31, here shown as four in number, two being located adjacent the upper end of side 23, and two being located adjacent floor 22. Similarly, CPU edge guides 32 are formed on side 24 in horizontal alignment with guides 31. Upper horizontal windows 33 are formed on sides 23 and 24 between guides 23 or 24, and lower ventilation windows 34 are formed adjacent the lower guides 31 and 32. Round holes are shown formed in sides 23, and square windows 37 are formed in side 24 for cross-flow of air.

Formed in the inner face of right lower side 26 are edge guides 41, and positioned between adjacent edge guides 41 are horizontally elongated windows 42. For cooling outwardly extending reinforcing edge 23 is formed on the outer edge of side 26 and inwardly extending reinforcing edge 44 is formed on the inner vertical edge of side 26. Inward extending ears 46 are formed on edge 44, and similar inward extending ears 47 are formed on the inner edges of side 23, and ears 48 are formed on the inner edges of side 24. Ears 46, 47, 48 are provided with threaded hole inserts to receive screws 16 which secure assembly 21 to the motherboard 11.

To retain sides 23 and 24 aligned parallel, a transverse horizontal stiffener 51, fabricated of 304 stainless steel or other suitable material, is provided. Stiffener 51 comprises a front panel 52, which is vertically disposed, and an aperture horizontal panel 53 extending inward from the lower edge of panel 52. Aperture ears 54 are bent upward at the rear side edges of panel 53, and are secured to the rear edges of sides 23 and 24 by screws (not shown).

Figure 2:
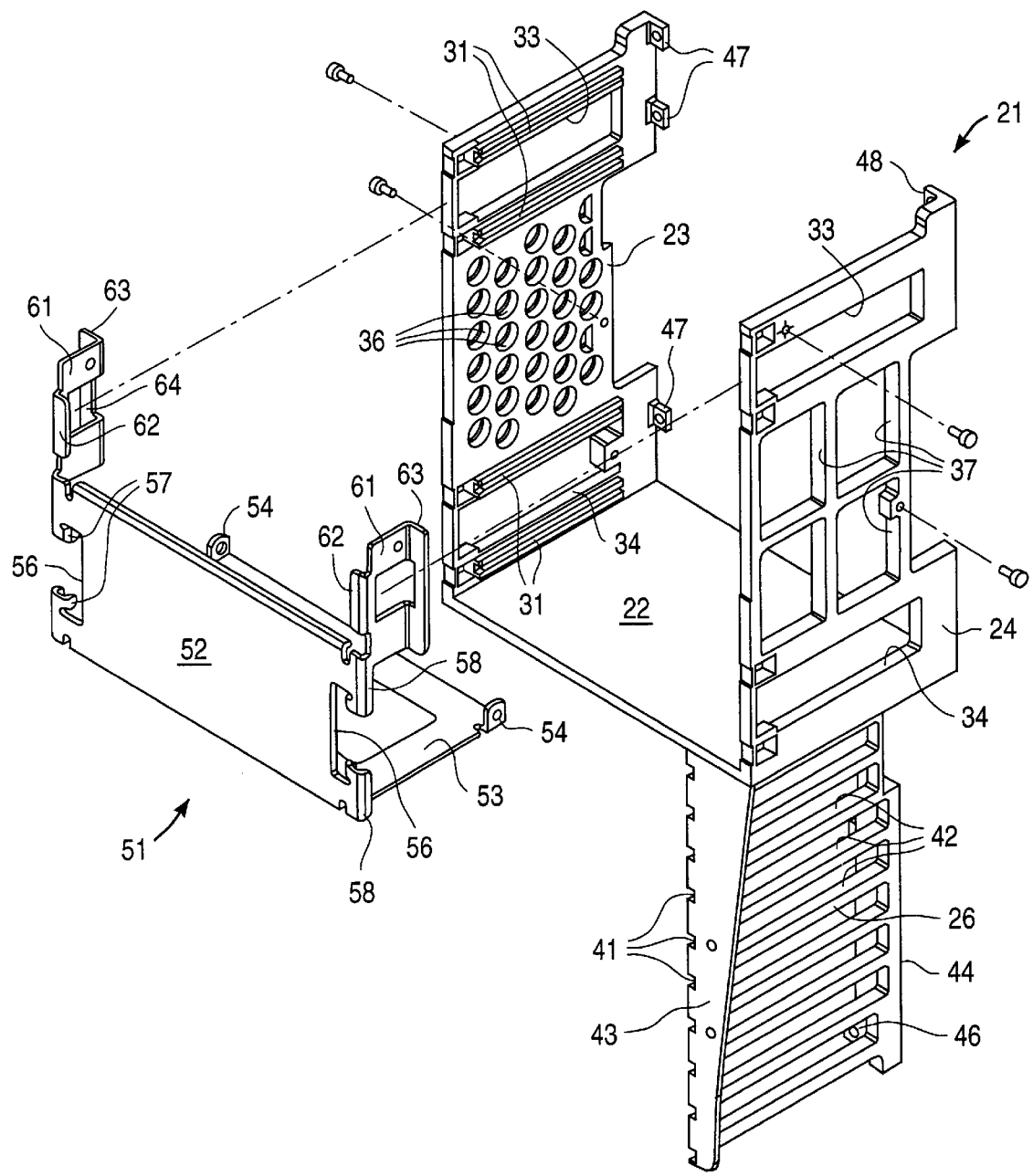
FIG. 2 is an exploded perspective view of the module.
Figure 3:
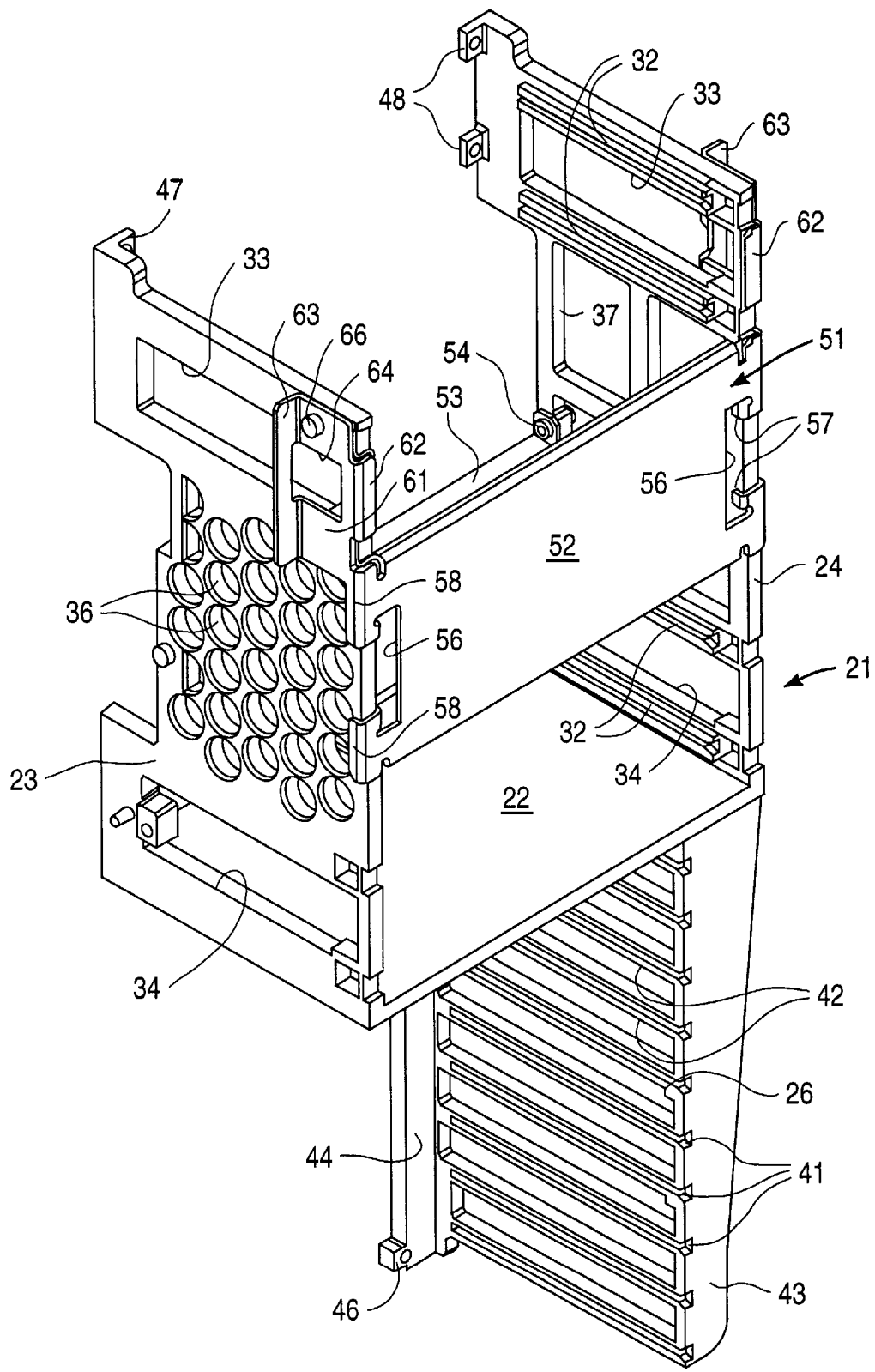
FIG. 3 is a perspective view of the module in assembled condition viewed from the front.

It will be noted, particularly with reference to FIG. 2, that the cutouts 56 have re-entrant shapes. The inner edges 57 are bent rearwardly as are the outer backward bends 58. The inner bends 57 engage the inner surfaces of sides 23 and 24, and the outer bends 58 engage the outer surfaces thereof, so that the edges of sides 23 and 24 are securely gripped by stiffener 51.

Extending vertically rearwardly-upwardly above panel 52 on either side of stiffener 51 and formed integrally therewith is an upward extension 61 formed with aperture 64. The vertical front edge 62 of extension 61 is bent inwardly and the rear vertical edge 63 thereof is bent outwardly. Extensions 61 engage the outer faces of sides 23 and 24 and front edges 62 engage the outer edges of sides 63 and 64. Vertical rear edges 63 project outwardly relative to sides 23 and 24. Extension 61 is formed with a hole adjacent its upper rear edge, and is attached thereby to the panels 23 or 24 by screws 66. Stiffener 51 thus engages the free edges of sides 23 and 24, holding them parallel and holding edge guides 31, 32 aligned.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A stiffener and guide for a motherboard having sockets into which electronic elements are plugged comprising substantially parallel sides having elements for attachment to first edges of said sides to the motherboard, said sides having opposed edge guides for the electronic elements whereby the elements may be slid into contact with the sockets, and a transverse member engaging second edges of said sides opposite said first edges to stiffen said sides and hold said sides in parallel relationship.

2. A stiffener according to claim 1 in which said second edges are formed with tenons and said transverse member with mortises to fit in said tenons.

3. A stiffener according to claim 1 in which said stiffener further comprises a panel fixed to a horizontal edge of said transverse member and means adjacent an end of said panel opposite said transverse member for attachment to said sides to further stiffen said sides.

4. A stiffener according to claim 3 in which said panel is formed with an aperture.

5. A stiffener according to claim 1 which further comprises a rearward vertical extension on either end of said transverse member, each said extension positioned to engage an outside surface of one said side.

6. A stiffener according to claim 1 which further comprises a horizontal transverse wall interconnecting the lower ends of said sides, said wall extending from said second edges to said first edges of said sides.

7. A stiffener according to claim 6 which further comprises a lower side below said wall parallel to but laterally offset relative to one said side, said lower side being formed with windows.

8. A stiffener according to claim 6 which further comprises a lower side below said wall parallel to and adjacent one said side, said lower side being formed with edge guides for PCI cards.

* * * * *